(12) United States Patent
Suto

(10) Patent No.: US 7,960,983 B2
(45) Date of Patent: Jun. 14, 2011

(54) CIRCUIT FOR DETECTING BONDING DEFECT IN MULTI-BONDING WIRE

(75) Inventor: Otokichi Suto, Sendai (JP)

(73) Assignee: Freescale Semiconductor, Inc., Austin, TX (US)

( * ) Notice: Subject to any disclaimer, the term of this patent is extended or adjusted under 35 U.S.C. 154(b) by 232 days.

(21) Appl. No.: 12/198,102

(22) Filed: Aug. 25, 2008

(65) Prior Publication Data

US 2010/0045328 A1 Feb. 25, 2010

(51) Int. Cl.
*G01R 31/00* (2006.01)
*G01R 31/26* (2006.01)
(52) U.S. Cl. ............ 324/750.3; 324/762.01; 324/762.03
(58) Field of Classification Search .................. None
See application file for complete search history.

(56) References Cited

U.S. PATENT DOCUMENTS 5,635,822 A * 6/1997 Marchio et al. ............... 323/273
6,410,936 B1 * 6/2002 Hongo ............................ 257/48

FOREIGN PATENT DOCUMENTS

JP 2005-331516 A 12/2005

* cited by examiner

*Primary Examiner* — Minh N Tang
(74) *Attorney, Agent, or Firm* — Charles Bergere

(57) ABSTRACT

An integrated circuit for detecting a bonding defect in a multi-bonding wire. The integrated circuit includes a plurality of pads each connectable by a bonding wire to a lead terminal. Voltage supplied to the lead terminal is applied in common to the plurality of pads. A detection circuit is operably connected to the plurality of pads. The detection circuit detects breakage of the bonding wires based on potentials at the plurality of pads.

7 Claims, 3 Drawing Sheets

CIRCUIT FOR DETECTING BONDING DEFECT IN MULTI-BONDING WIRE

BACKGROUND OF THE INVENTION

The present invention relates to an integrated circuit including a detection circuit for detecting a bonding defect in a multi-bonding wire.

A multi-bonding structure known in the prior art uses a plurality of wires to connect a plurality of pads on an integrated circuit (IC chip) to a single lead terminal of a lead frame, which supports the integrated circuit (IC chip). Such a multi-bonding wire structure is used to improve product reliability particularly in power IC products used to control large currents. The integrated circuit undergoes inspection to test for wire breakage before being shipping from the factory as a product. However, a product including a multi-bonding wire structure would still be operable even if one of the plurality bonding wires connected to a single lead terminal is broken. In such a case, breakage of the bonding wire cannot be accurately determined using just an external testing device such as a tester that detects the resistance or voltage of the lead terminal.

To ensure product reliability, when one of a plurality of wires is broken in a product, that product must be determined as being defective. Japanese Laid-Open Patent Publication No. 2005-331516 describes a method that tests for wire breakage using an electric field sensor. However, with the art described in the above publication, bonding defects in an integrated circuit having a multi-bonding wire structure are not readily detected.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
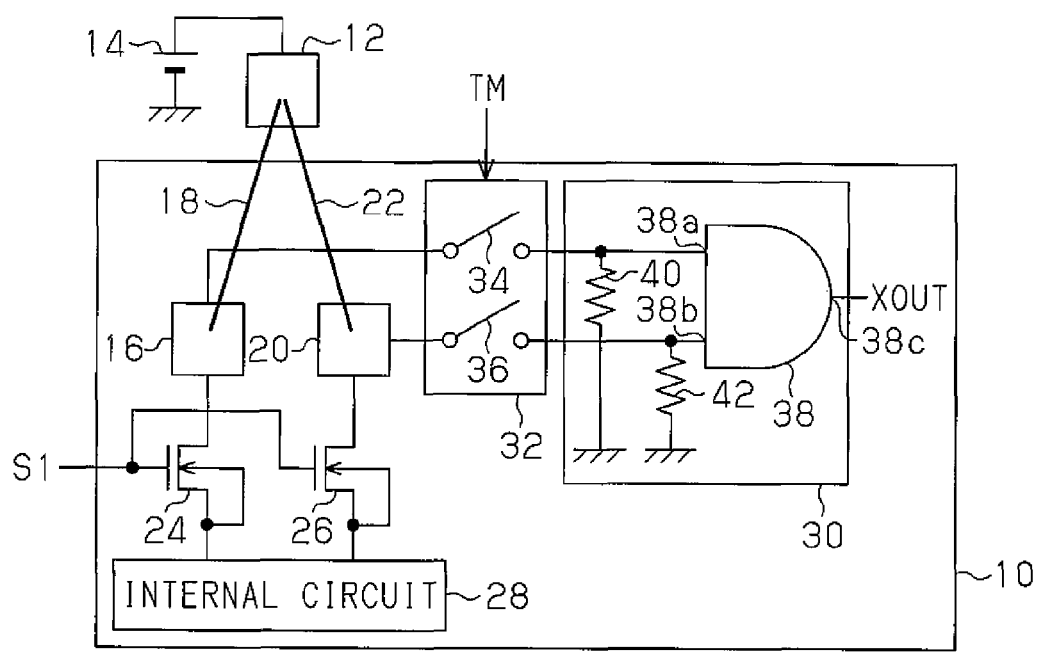
FIG. 1 is a schematic circuit diagram of a first embodiment of an integrated circuit according to the present invention that enables detection of breakage in a double-bonding wire.

In the drawings, like numerals are used for like elements throughout.

The present invention provides an integrated circuit that easily detects bonding defects in a multi-bonding wire structure. A first aspect of the present invention is an integrated circuit for connection to a lead terminal that is supplied with voltage. The integrated circuit includes a plurality of pads each connectable by a bonding wire to the lead terminal. Voltage that is supplied to the lead terminal is applied in common to the plurality of pads. A detection circuit operably connected to the plurality of pads detects breakage of the bonding wires based on potentials at the plurality of pads.

A second aspect of the present invention is an integrated circuit for connection to a lead terminal that is supplied with voltage. The integrated circuit includes a first pad connectable to the lead terminal by a first wire. A second pad is connectable to the lead terminal by a second wire. Voltage that is supplied to the lead terminal is commonly applied to the first and second pads. A detection circuit includes a first input terminal and a second input terminal. A first switch element is connected between the first pad and the first input terminal of the detection circuit. A second switch element is connected between the second pad and the second input terminal of the detection circuit. The first and second switch elements are simultaneously activated in a test mode. The detection circuit detects breakage of at least one of the first and second wires in the test mode based on potential at the first pad and potential at the second pad.

A third aspect of the present invention is an integrated circuit for connection to a lead terminal that is supplied with voltage. The integrated circuit includes a first pad connected to the lead terminal by a first wire. A second pad is connected to the lead terminal by a second wire. A third pad is connected to the lead terminal by a third wire. Voltage that is supplied to the lead terminal is commonly applied to the first, second, and third pads. Wiring connecting the first, second, and third pads includes a connection node between the first, second, and third pads. A detection circuit includes a first input terminal connected to the connection node of the wiring and a second input terminal. A switch element is connected between one of the first, second, and third pads and the second input terminal of the detection circuit. The switch element is activated in a test mode. The detection circuit detects breakage of at least one of the first, second, and third wires in the test mode based on a potential difference between one of the first, second, and third pads connected to the switch element and the connection node of the wiring.

Other aspects and advantages of the present invention will become apparent from the following description, taken in conjunction with the accompanying drawings, illustrating by way of example the principles of the invention.

Referring now to FIG. 1, a first embodiment of an integrated circuit 10 (IC) according to the present invention will now be described. FIG. 1 is a schematic circuit diagram of the IC 10, which detects breakage in a double bonding wire. The IC 10 is supported by a die pad of a lead frame (not shown). Bonding wires electrically connect the IC 10 to a plurality of lead terminals 12 (only one shown in FIG. 1) on a lead frame. Each lead terminal 12 is connected to a power supply 14, which supplies high power supply voltage.

The IC 10 includes a plurality of pads connected to a single lead terminal 12. In the example shown in FIG. 1, two pads 16 and 20 are connected to a lead terminal 12. In the same manner, two pads are connected to each of the other lead terminals (not shown). The pad 16 is connected to the lead terminal 12 by a bonding wire 18, and the pad 20 is connected to the lead terminal 12 by a bonding wire 22. Accordingly, the high power supply voltage supplied from the power supply 14 to the lead terminal 12 is commonly applied to the two pads 16 and 20 via the bonding wires 18 and 22.

Power transistors 24 and 26, which are driven by a control signal S1, are respectively connected to the pads 16 and 20. The power transistors 24 and 26 are formed by N-type MOS transistors. Further, the power transistors 24 and 26 have drains that are respectively connected to the pads 16 and 20 and sources that are connected to an internal circuit 28. When activated by a control signal S1 having a high level, the power transistors 24 and 26 supplies the internal circuit 28 with the current flowing to the pads 16 and 20.

The IC 10 includes a detection circuit 30 operably connected to the two pads 16 and 20. The detection circuit 30 detects breakage defects of the bonding wires 18 and 22 based on potentials at the pads 16 and 20. The IC 10 functions in a normal mode and a test mode. The detection circuit 30 is inactive in the normal mode and active in the test mode. The IC 10 is subjected to the test mode before being shipped out of the factory as a product.

More specifically, the detection circuit 30 is connected to the pads 16 and 20 via a switch circuit 32, which is controlled by a test mode signal TM. The switch circuit 32 includes a plurality of switch elements (two switch elements 34 and 36 in this embodiment) and connects each of the two pads 16 and 20 to the detection circuit 30. The test mode signal TM simultaneously activates the switch elements 34 and 36 in the test mode.

The detection circuit 30 includes an AND gate 38, which has a first input terminal 38a, a second input terminal 38b, and an output terminal 38c. The first input terminal 38a is connected to the pad 16 via the switch element 34. The second input terminal 38b is connected to the pad 20 via the switch element 36. Further, the first input terminal 38a is connected to ground via a pull-down resistor 40. The second input terminal 38b is connected to ground via a pull-down resistor 42.

The operation of the IC 10 will now be discussed.

In the test mode, the test mode signal TM activates the switch elements 34 and 36. As a result, the detection circuit 30 becomes active. The power transistors 24 and 26 connected to the pads 16 and 20 are deactivated in the test mode. Accordingly, the detection circuit 30 detects defects (wire breakage) in the bonding wires 18 and 22 when the power transistors 24 and 26 are in a deactivated state. However, the detection circuit may also test the bonding wires 18 and 22 for defects when the power transistors 24 and 26 are in an activated state.

When the bonding wires 18 and 22 are both not broken, the potentials at the two pads 16 and 20 are substantially the same as the high power supply voltage of the power supply 14. Accordingly, the AND gate 38 generates an output signal XOUT with a logic value of "1".

When the bonding wire 22 is not broken but the bonding wire 18 is broken, the potential at the pad 20 is high but the potential at the pad 16 is "0". Accordingly, the logic value of the output signal XOUT is "0". In the same manner, when the bonding wire 18 is not broken but the bonding wire 22 is broken, the logic value of the output signal XOUT is "0". Furthermore, when the bonding wires 18 and 22 are both broken, the potentials at the two pads 16 and 20 are "0". Thus, the logic value of the output signal XOUT is "0".

In this manner, the detection circuit 30 detects a bonding defect (logic value of "0") not only when the two bonding wires 18 and 22 are both broken but also when one of the two bonding wires 18 and 22 is broken. Therefore, breakage of a double bonding wire in the integrated circuit 10 (IC chip) can be detected without using an external testing device such as a tester.

The IC 10 of the first embodiment has the advantages described below.

The detection circuit 30 detects wire breakage even when one of the bonding wires 18 and 22 is broken and current flows through the other one of the bonding wires 18 and 22.

The detection circuit 30 incorporated in the IC 10 monitors pad potentials to detect a bonding defect. Thus, the integrated circuit 10 can easily be tested for defects without using a tester.

The two bonding wires 18 and 22, which are connected to the lead terminal 12, are simultaneously tested for defects. This shortens the time required to test for defects.

Based on the test mode signal TM, the detection circuit 30 is active only during the test mode. Thus, the detection circuit 30 does not increase current consumption of the IC 10 during the normal mode.

Figure 2:
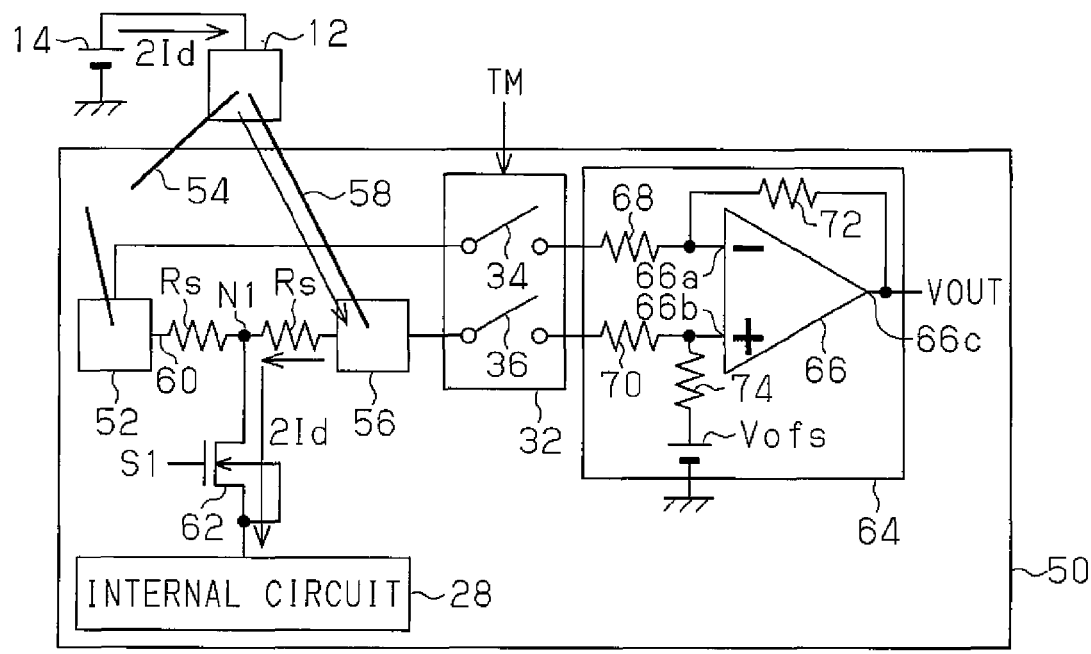
FIG. 2 is a schematic circuit diagram of a second embodiment of an integrated circuit according to the present invention that enables detection of breakage in a double-bonding wire.

A second embodiment of an integrated circuit 50 according to the present invention will now be described with reference to FIG. 2. FIG. 2 is a schematic circuit diagram of the IC 50, which detects breakage in a double bonding wire. The IC 50 includes two pads 52 and 56 respectively connected by bonding wires 54 and 58 to a single lead terminal 12. High power supply voltage is commonly applied to the pads 52 and 56. FIG. 2 shows a state in which one of the bonding wires, namely, the bonding wire 54, is broken.

Metal wiring 60 connecting the two pads 52 and 56 to each other is arranged between the two pads 52 and 56. The metal wiring 60 is connected to a power transistor 62. A connection node N1 between the power transistor 62 and the metal wiring 60 serves as a connection node between the two pads 52 and 56. The connection node N1 is located at substantially the middle of the pads 52 and 56. Accordingly, the metal wiring 60 between the pad 52 and the connection node N1 and the metal wiring 60 between the pad 56 and the connection node N1 have the same resistance (equivalent resistance Rs).

The power transistor 62, which is formed by an N-type MOS transistor, includes a drain connected to the connection node N1 and a source connected to an internal circuit 28. When activated by the control signal S1, the power transistor 62 supplies the internal circuit 28 with the current flowing to the pads 52 and 56. For example, when a power supply 14 supplies the lead terminal 12 with current 2Id, current Id flows to each of the bonding wires 54 and 58. The current Id flowing from each of the pads 52 and 56 are synthesized at the connection node N1. In such a state, if the bonding wire 54 were to be broken, the entire current 2Id would flow to the other bonding wire 58. In any case, the power transistor 62 supplies the internal circuit 28 with the current 2Id flowing from the power supply 14 to the lead terminal 12.

The IC 50 includes a detection circuit 64 operably connected to the two pads 52 and 56. In the same manner as in the first embodiment, the detection circuit 64 is connected to the pads 52 and 56 via switch elements 34 and 36 and detects breakage of the bonding wires 54 and 58 in a test mode based on potentials at the pads 16 and 20. The switch elements 34 and 36 operate in the same manner as in the first embodiment.

The detection circuit 64 is a differential amplification circuit and includes an operational amplifier 66, which has an inversion input terminal 66a, a non-inversion input terminal 66b, and an output terminal 66c. The inversion input terminal 66a is connected to the pad 52 via a first input resistor 68 and the switch element 34. Further, a feedback resistor 72 is connected between the inversion input terminal 66a and the output terminal 66c. The non-inversion input terminal 66b is connected to the pad 56 via a second input resistor 70 and the switch element 36. Further, the non-inversion input terminal 66b is connected via a third input resistor 74 to a reference power supply, which supplies the operational amplifier 66 with offset voltage Vofs. The first and second input resistors 68 and 70 are each set to have resistance R1, and the third input resistor 74 and the feedback resistor 72 are each set to have resistance R2. Based on the potential difference Vd between the two pads 52 and 56, the detection circuit 64 (differential amplifier) generates an output signal VOUT, which is expressed by equation 1.

$$VOUT = Vofs \pm (R2/R1) * Vd \qquad \text{Equation 1}$$

The operation of the IC 50 will now be discussed.

In the test mode, the test mode signal TM activates the switch elements 34 and 36. As a result, the detection circuit 64 becomes active. Further, the power transistor 62 is activated in the test mode. Accordingly, the detection circuit 64 of the second embodiment detects wire breakage in the bonding wires 54 and 58 when the power transistor 62 is in an activated state.

When the bonding wires 54 and 58 are both not broken, the potentials at the two pads 52 and 56 are substantially the same as the high power supply voltage of the power supply 14. That is, the potential difference Vd between the pads 52 and 56 is "0". In this case, the detection circuit 64 generates an output signal VOUT, which has the first detection voltage Vofs (offset voltage) based on equation 1.

When the bonding wire 58 is not broken but the bonding wire 54 is broken, current flows to the pad 56 but not to the pad 52. In such a case, the current flows from the pad 56 via the connection node N1 to the power transistor 62 (refer to FIG. 2). Thus, the potential at the pad 56 is higher than the potential at the pad 52. When the value of the current flowing to the pad 56 is represented by "$I_D$" (where "$I_D$" is equal to the value of the current flowing to from the power supply 14 to the lead terminal 12), the potential difference Vd between the two pads 52 and 56 ("potential at the pad 56"−"potential at the pad 52") is "$Rs*I_D$". Here, Rs represents an equivalent resistance of the wiring portions between the connection node N1 and the pads 52 and 56. Accordingly, the detection circuit 64 generates the output signal VOUT having a second detection voltage "$Vofs+(R2/R1)*(Rs*I_D)$".

When the bonding wire 54 is not broken but the bonding wire 58 is broken, current flows only to the pad 52. Thus, the potential at the pad 52 is higher than the potential at the pad 56. In this case, the potential difference Vd ("potential at the pad 56"−"potential at the pad 52") is "$-Rs*I_D$". Accordingly, the detection circuit 64 generates the output signal VOUT having a third detection voltage "$Vofs-(R2/R1)*(Rs*I_D)$".

When the bonding wires 54 and 58 are both broken, current does not flow to the pads 52 and 56. In this state, the output signal VOUT has the first detection voltage Vofs. When the bonding wires 54 and 58 are both broken, the output signal VOUT is the same as that when the two wires 54 and 58 are both not broken. If the wires 54 and 58 are both broken, normal electrical testing can be conducted to determine defects.

In this manner, the detection circuit 64 detects a bonding defect based on the potential difference Vd between the two pads 52 and 56. If any one of the bonding wires 54 and 58 is broken, the detection circuit 64 determines that the IC 50 is defective. Therefore, breakage of a double bonding wire in the IC 0 can be detected without using an external testing device such as a tester.

In addition to the advantages of the IC 10 of the first embodiment, the IC 50 of the second embodiment has the advantages described below.

The detection circuit 64 generates one of the first to third detection voltages based on the potential difference Vd between the pads 52 and 56. Therefore, a broken bonding wire can be located by using the output signal VOUT of the detection circuit 64.

Figure 3:
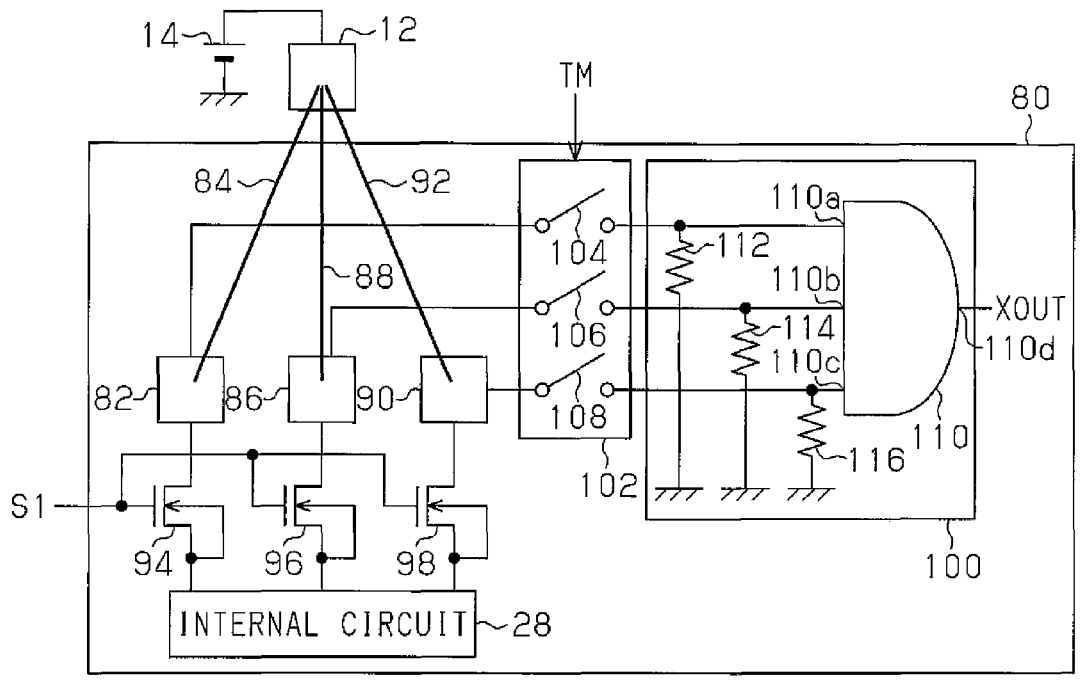
FIG. 3 is a schematic circuit diagram of a third embodiment of an integrated circuit according to the present invention that enables detection of breakage in a triple-bonding wire.

A third embodiment of an integrated circuit 80 according to the present invention will now be described with reference to FIG. 3. FIG. 3 is a schematic circuit diagram of the IC 80, which detects breakage in a triple bonding wire. The IC 80 includes three pads 82, 86, and 90, which are respectively connected by bonding wires 84, 88, and 92 to a single lead terminal 12. High power supply voltage is commonly applied to the pads 82, 86, and 90.

Power transistors 94, 96, and 98 (preferably, N-type MOS transistors), which are driven by a control signal S1, respectively connect the pads 82, 86, and 90 to an internal circuit 28. In this case, the drains of the power transistors 94, 96, and 98 are connected to the pads 82, 86, and 90.

The IC 80 includes a detection circuit 100 connected to the pads 82, 86, and 90 via a switch circuit 102. The switch circuit 102 includes three switch elements 104, 106, and 108, which are simultaneously activated in the test mode by a test mode signal TM. In the same manner as in the first embodiment, the power transistors 94, 96, and 98 are deactivated in the test mode.

The detection circuit 100 includes an AND gate 110 that has a first input terminal 110a, a second input terminal 110b, a third input terminal 110c, and an output terminal 110d. The first, second, and third input terminals 110a, 110b, and 110c are connected via switch elements 104, 106, and 108 to the pads 82, 86, and 90, respectively. Further, the first, second, and third input terminals 110a, 110b, and 110c are connected to ground via pull-down resistors 112, 114, and 116, respectively.

The operation of the IC 80 in the test mode will now be discussed.

When none of the bonding wires 84, 88, and 92 are broken, the potentials at the pads 82, 86, and 90 are substantially high power supply voltages. Accordingly, the AND gate 110 generates an output signal XOUT with a logic value of "1". If any one of the bonding wires 84, 88, and 92 are broken, the potential at one of the pads 82, 86, and 90 is "0". Accordingly, the AND gate 110 generates the output signal XOUT with a logic value "0".

The IC 80 of the third embodiment has the advantages described below.

When any one of the bonding wires 84, 88, and 92 is broken, the detection circuit 100 detects the wiring breakage defect even when current is flowing through the other wires.

The detection circuit 100 incorporated in the IC 80 monitors the pad potentials to detect a bonding defect. Thus, the IC 80 can easily be tested for defects without using a tester.

The three bonding wires 84, 88, and 92, which are connected to the lead terminal 12, are simultaneously tested for defects. This shortens the time required to test for defects.

In accordance with the test mode signal TM, the detection circuit 100 becomes active only during the test mode. Thus, the detection circuit 100 does not increase current consumption of the IC 80 during the normal mode.

Figure 4:
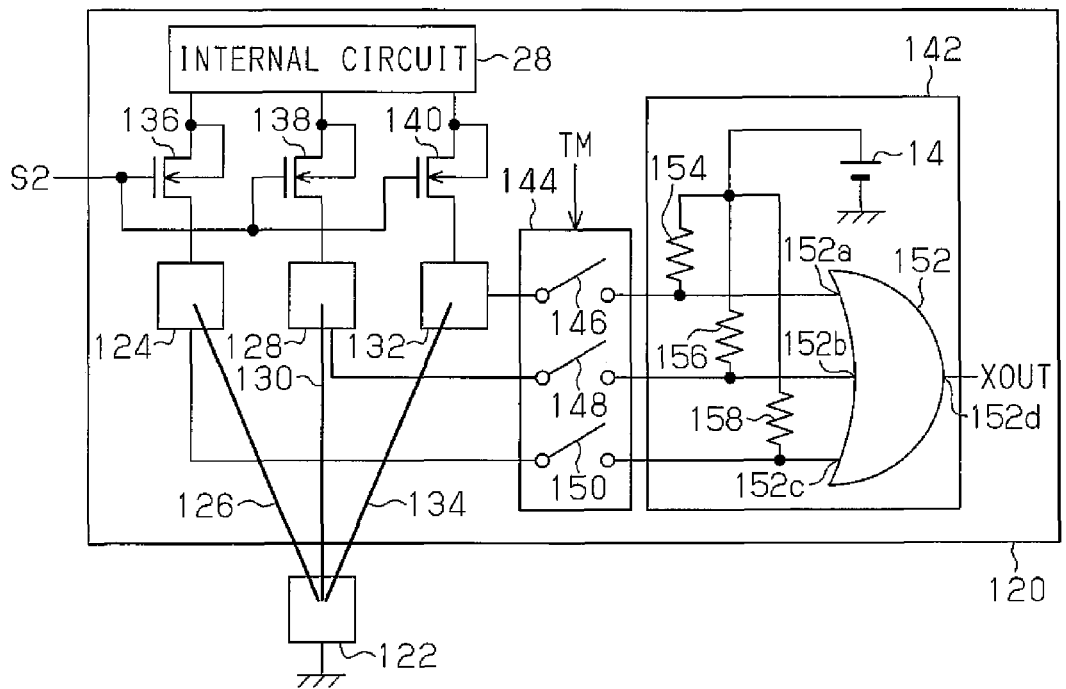
FIG. 4 is a schematic circuit diagram of a fourth embodiment of an integrated circuit according to the present invention that enables detection of breakage in a triple-bonding wire.

A fourth embodiment of an integrated circuit 120 according to the present invention will now be described with reference to FIG. 4. FIG. 4 is a schematic circuit diagram of the IC 120, which detects breakage in a triple bonding wire. The IC 120 is connected to a lead terminal 122, which is supplied with ground voltage. Accordingly, the IC 120 of the fourth embodiment detects breakage in a triple bonding wire connected to the lead terminal 122 that is located at the ground side.

Three pads 124, 128, and 132 are respectively connected by bonding wires 126, 130, and 132 to the lead terminal 122. Ground voltage is commonly applied to the pads 124, 128, and 132. Power transistors 136, 138, and 140 (preferably, N-type MOS transistors), which are driven by a control signal S2, respectively connect the pads 124, 128, and 132 to an internal circuit 28. In this case, the sources of the power transistors 136, 138, and 140 are connected to the pads 124, 128, and 132.

The IC 120 includes a detection circuit 142 connected to the pads 124, 128, and 132 via a switch circuit 144. The switch circuit 144 includes three switch elements 146, 148, and 150, which are simultaneously activated in the test mode by a test mode signal TM. In the same manner as in the first embodiment, the power transistors 136, 138, and 140 are deactivated in the test mode.

The detection circuit 142 includes an OR gate 152 (logic gate), which has a first input terminal 152a, a second input terminal 152b, a third input terminal 152c, and an output terminal 152d. The first, second, and third input terminals 152a, 152b, and 152c are connected via switch elements 146, 148, and 150 to the pads 124, 128, and 132, respectively. Further, the first, second, and third input terminals 152a, 152b, and 152c are connected to a power supply 14 (high voltage power supply) via pull-up resistors 154, 156, and 158, respectively.

The operation of the IC 120 in the test mode will now be discussed.

When none of the bonding wires 126, 130, and 134 are broken, the potentials at the pads 124, 128, and 132 substantially have ground voltage. Accordingly, the OR gate 152 generates an output signal XOUT with a logic value of "0". If any one of the bonding wires 126, 130, and 134 are broken, the potential at one of the pads 124, 128, and 132 is high (logically high level). Accordingly, the OR gate 152 generates the output signal XOUT with a logic value of "1". The integrated circuit 120 of the fourth embodiment has the same advantages as the third embodiment.

Figure 5:
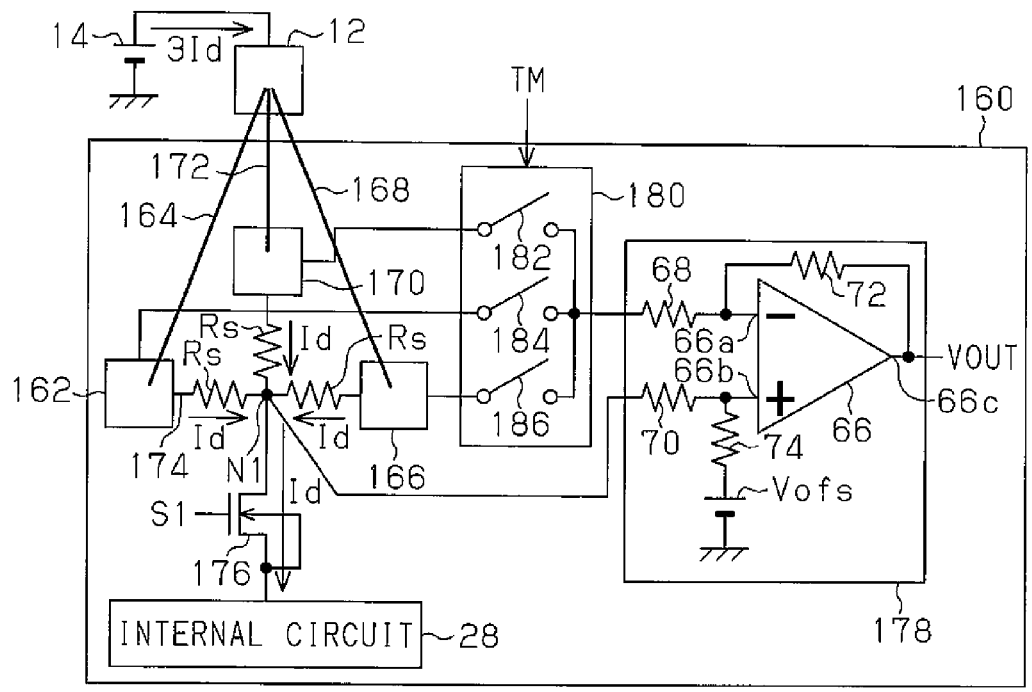
FIG. 5 is a schematic circuit diagram of a fifth embodiment of an integrated circuit according to the present invention that enables detection of breakage in a triple-bonding wire.

A fifth embodiment of an integrated circuit 160 according to the present invention will now be described with reference to FIG. 5. FIG. 5 is a schematic circuit diagram of the IC 160, which detects breakage in a triple bonding wire. The integrated circuit 160 includes three pads 162, 166, and 170 respectively connected by bonding wires 164, 168, and 172 to a single lead terminal 12. High power supply voltage is commonly applied to the pads 162, 166, and 170.

Metal wiring 174 for connecting the three pads 162, 166, and 170 is arranged between the three pads 162, 166, and 170. The metal wiring 174 is connected to a power transistor 176 (preferably, N-type MOS transistor), which is driven by a control signal S1. More specifically, the power transistor 176 includes a drain connected to a connection node N1 and a source connected to an internal circuit 28. In the same manner as in the second embodiment, the power transistor 176 is activated in the test mode. Portions of the metal wiring 174 between the connection node N1 and the pads 162, 166, and 170 have equivalent resistance Rs.

The power transistor 176 supplies the internal circuit 28 with the current flowing to the pads 162, 166, and 170. For example, when a power supply 14 supplies the lead terminal 12 with current 3Id, current Id flows to each of the bonding wires 164, 168, and 172. The current Id flowing from each of the pads 162, 166, and 170 are synthesized at the connection node N1. In such a state, if the bonding wire 164 were to be broken, the entire current 3Id would flow to the other bonding wires 168 and 172. In any case, the power transistor 176 supplies the internal circuit 28 with the current 3Id flowing from the power supply 14 to the lead terminal 12.

The IC 160 includes a detection circuit 178 operably connected to the three pads 162, 166, and 170. The detection circuit 178 is a differential amplification circuit and has a structure similar to that of the detection circuit 64 in the second embodiment. The detection circuit 178 includes a first input terminal (inversion input terminal 66a of an operational amplifier 66), which is connected to a switch circuit 180, and a second input terminal (non-inversion input terminal 66b of the operational amplifier 66), which is connected to the connection node N1.

The switch circuit 180 includes three switch elements 182, 184, and 186 respectively connected to the three pads 170, 162, and 166. A test mode signal TM selectively activates one of the switch elements 182, 184, and 186. For example, the test mode signal is sequentially provided to the switch elements 182, 184, and 186 in the test mode. The detection circuit 178 (differential amplification circuit) detects the potential difference Vd between the selected one of the three pads 162, 166, and 170 and the connection node N1 and generates an output signal VOUT, which is expressed by equation 1.

The operation of the IC 160 will now be discussed.

Among the three switch elements 182, 184, and 186, for example, when the switch element 184 is activated, the detection circuit 178 detects the potential difference Vd between the connection node N1 and the pad 162. If the bonding wire 164 is broken, current does not flow from the pad 162 to the node N1. That is, a potential difference is not generated between the node N1 and the pad 162. Accordingly, the second term in equation 1 is "0" and the output signal VOUT is "Vofs". This ends the testing for defects regardless of whether or not the remaining two bonding wires 168 and 172 are in a conductive state.

If the bonding wire 164 is not broken, current flows from the pad 162 to the node N1. Accordingly, the potential at the pad 162 becomes higher than the potential at the node N1. When the value of the current flowing from the pad 162 to the node N1 is represented by "$I_D$", the potential difference Vd ("potential at node N1"–"potential at the pad 162") is "$-Rs*I_D$". Accordingly, the output signal VOUT is expressed as "Vofs–(R2/R1)*(Rs*$I_D$)". In this state, the current value $I_D$ varies in accordance with the conductive state of the other two bonding wires 168 and 172. For example, when the value of the current supplied to the lead terminal 12 is "3Id", if none of the other bonding wires 168 and 172 are broken, the current value $I_D$ is "Id". If any one of the other bonding wires 168 and 172 is broken, the current value $I_D$ is "3Id/2". If the other bonding wires 168 and 172 are both broken, the current value $I_D$ is "3Id". In this manner, the output signal VOUT varies in accordance with the conductive state of the other bonding wires 168 and 172. Accordingly, when the switch element 184 is activated, the detection circuit 178 not only detects breakage of the bonding wire 164 but also simultaneously detects breakage of the other two bonding wires 168 and 172. To ensure detection of a bonding defect, it is preferable that the switch elements 182, 184, and 186 be selectively switched one by one to sequentially detect whether current $I_D$ is flowing between each pad and the node N1.

In addition to the advantages of the IC 80 in the third embodiment, the IC 160 of the fifth embodiment has the advantages described below.

The detection circuit 178 simultaneously tests the three bonding wires 164, 168, and 172, which are connected to the connection node N1, for defects based on the potential difference Vd between the selected one of the pads (162, 166, or 170). This shortens the time required to test for defects.

One of the three switch elements 182, 184, and 186 is selectively switched by the test mode signal TM when necessary so as to sequentially detect the current flowing from each pad to the connection node N1. This further ensures detection of a breakage in a triple bonding wire.

Figure 6:
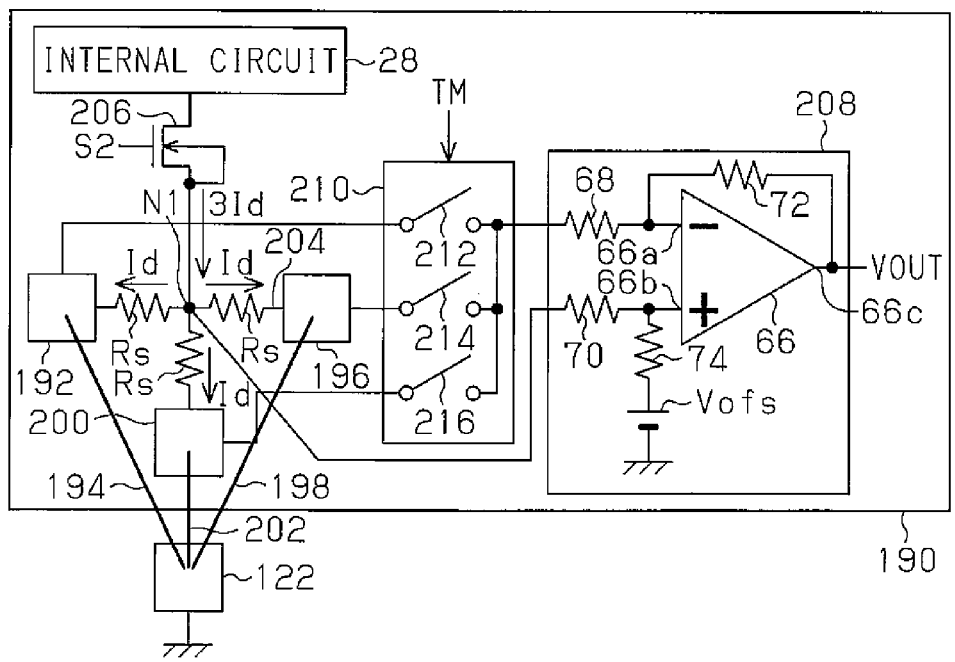
FIG. 6 is a schematic circuit diagram of a sixth embodiment of an integrated circuit according to the present invention that enables detection of breakage in a triple-bonding wire.

A sixth embodiment of an integrated circuit 190 according to the present invention will now be described with reference to FIG. 6. FIG. 6 is a schematic circuit diagram of the integrated circuit 190, which detects breakage in a triple bonding wire. The integrated circuit 190 is connected to a lead terminal 122, which is supplied with ground voltage. Accordingly, the integrated circuit 190 of the sixth embodiment detects breakage in a triple bonding wire connected to the lead terminal 122 that is located at the ground side.

Three pads 192, 196, and 200 are respectively connected by bonding wires 194, 198, and 202 to the lead terminal 122. Metal wiring 204 is arranged between the pads 192, 196, and 200. A power transistor 206 (preferably, N-type MOS transistor), which is driven by a control signal S2, is connected to a connection node N1 in the metal wiring 204. More specifically, the power transistor 206 has a source connected to the node N1 and a drain connected to an internal circuit 28.

The integrated circuit 190 includes a detection circuit 208, which is a differential amplification circuit and has a structure similar to that of the detection circuit 64 in the second embodiment (FIG. 2). Three switch elements 212, 214, and 216 (switch circuit 210) are connected between a first input terminal of the detection circuit 208 (inversion input terminal 66a of an operational amplifier 66) and the three pads 192, 196, and 200, respectively. A test mode signal TM selectively activates one of the switch elements 212, 214, and 216.

The operation of the integrated circuit 190 will now be discussed.

Among the three switch elements 212, 214, and 216, for example, when the switch element 212 is activated, the detection circuit 208 detects the potential difference Vd between the connection node N1 and the pad 192. If the bonding wire 194 is broken, the output signal VOUT is "Vofs". This ends the testing for defects. If the bonding wire 194 is not broken, current flows from the node N1 to the pad 192. Accordingly, the potential at the node N1 becomes higher than the potential at the pad 192. When the value of the current flowing from the node N1 to the pad 162 is represented by "$I_D$", the potential difference Vd ("potential at node N1"-"potential at the pad 192") is "$Rs*I_D$". Accordingly, the output signal VOUT is expressed as "Vofs+(R2/R1)*(Rs*$I_D$)". In this state, the current value $I_D$ (i.e., output signal VOUT) varies in accordance with the conductive state of the other two bonding wires 198 and 202. When the switch element 212 is activated, the detection circuit 208 not only detects breakage of the bonding wire 194 but also simultaneously detects breakage of the other two bonding wires 198 and 202. To ensure detection of a bonding defect, it is preferable that the switch elements 212, 214, and 216 be selectively switched one by one to sequentially detect whether current $I_D$ is flowing between each pad and the node N1. The integrated circuit 190 of the sixth embodiment has the same advantages as the integrated circuit 160 of the fifth embodiment.

It should be apparent to those skilled in the art that the present invention may be embodied in many other specific forms without departing from the spirit or scope of the invention. Particularly, it should be understood that the present invention may be embodied in the following forms.

In each of the above embodiments, the detection circuit that detects bonding defects at the side of the high voltage power supply 14 (e.g., embodiment shown in FIG. 4) may be combined with the detection circuit that detects bonding defects at the ground side (e.g. embodiment shown in FIG. 4).

In each of the above embodiments, the multi-bonding of which breakage is detected may include four or more wires.

The fifth and sixth embodiments may be modified to include only one switch element.

The present examples and embodiments are to be considered as illustrative and not restrictive, and the invention is not to be limited to the details given herein, but may be modified within the scope and equivalence of the appended claims.

What is claimed is:

1. An integrated circuit for connection to a lead terminal that is supplied with voltage, the integrated circuit comprising:
    a plurality of pads each connectable by a bonding wire to the lead terminal, wherein voltage that is supplied to the lead terminal is commonly applied to the plurality of pads;
    a detection circuit including a logic gate that is operably connected to the plurality of pads, wherein the detection circuit detects potentials at the plurality of pads in order to detect breakage of the bonding wires based on the detected potentials;
    a plurality of power transistors respectively connected to the plurality of pads; and
    a plurality of switch elements arranged between the plurality of pads and the logic gate, wherein the plurality of switch elements respectively connect the plurality of pads to the logic gate and are substantially simultaneously activated by a test mode signal.

2. The integrated circuit according to claim 1, wherein the integrated circuit functions in a normal mode and a test mode, with the detection circuit being inactive in the normal mode and active in the test mode.

3. The integrated circuit according to claim 1, wherein the detection circuit detects breakage of the bonding wires when the plurality of power transistors are deactivated.

4. The integrated circuit according to claim 1, wherein the logic gate is an AND gate.

5. The integrated circuit according to claim 1, wherein high power supply voltage is supplied to the lead terminal and is commonly applied to the plurality of pads.

6. The integrated circuit of claim 1, wherein the plurality of power transistors comprise NMOS devices having drain terminals connected to respective ones of the plurality of pads.

7. An integrated circuit for connection to a lead terminal that is supplied with voltage, the integrated circuit comprising:
    a first pad connectable to the lead terminal by a first wire;
    a second pad connectable to the lead terminal by a second wire, with voltage that is supplied to the lead terminal being commonly applied to the first and second pads;
    a detection circuit including a first input terminal and a second input terminal;
    a first switch element connected between the first pad and the first input terminal of the detection circuit; and
    a second switch element connected between the second pad and the second input terminal of the detection circuit, with the first and second switch elements being simultaneously activated in a test mode;
    wherein the detection circuit detects breakage of at least one of the first and second wires in the test mode based on potential at the first pad and potential at the second pad.

* * * * *